United States Patent [19]

Matsushita

[11] Patent Number: 5,347,488

[45] Date of Patent: Sep. 13, 1994

[54] SEMICONDUCTOR MEMORY DEVICE FOR GENERATING A CONTROLLING SIGNAL TO SELECT A WORD LINE

[75] Inventor: Yuichi Matsushita, Miyazaki, Japan

[73] Assignee: Oki Electric Industry Co., Ltd., Tokyo, Japan

[21] Appl. No.: 19,698

[22] Filed: Feb. 19, 1993

[30] Foreign Application Priority Data

Feb. 20, 1992 [JP] Japan .................................. 4-033245

[51] Int. Cl.⁵ .............................................. G11C 7/00
[52] U.S. Cl. .......................... 365/189.11; 365/189.09; 365/230.06
[58] Field of Search ...................... 365/189.09, 189.11, 365/230.06

[56] References Cited

U.S. PATENT DOCUMENTS 4,896,297  1/1990  Miyatake et al. ............. 365/189.11
5,214,602  5/1993  Lines ............................. 365/189.11

FOREIGN PATENT DOCUMENTS 1307092  12/1989  Japan .

*Primary Examiner*—Eugene R. LaRoche
*Assistant Examiner*—F. Niranjan
*Attorney, Agent, or Firm*—Spencer, Frank & Schneider

[57] ABSTRACT

A semiconductor memory device of the present invention comprises a memory cell group having a plurality of memory cells for storing data therein and a plurality of word lines each used to select a desired memory cell, a first signal line held at a first potential which enables the memory cells to operate sufficiently, a second signal line held at a second potential which enables a driver circuit to operate sufficiently, the driver circuit provided between the first signal line and the word lines, a decoder for receiving an address signal therein and for outputting access request signals each used to obtain access to a memory cell designated by the received address signal, at least one driving signal generator for receiving one of the access request signals therein and supplying a driving signal having the second potential of the second signal line to the driver circuit so as to activate the driver circuit, a first booster operated in response to the turning on of a power source so as to set the second signal line to the second potential, and a second booster operated in response to the generation of the access request signal so as to set the second signal line to the second potential.

18 Claims, 3 Drawing Sheets

SEMICONDUCTOR MEMORY DEVICE FOR GENERATING A CONTROLLING SIGNAL TO SELECT A WORD LINE

BACKGROUND OF THE INVENTION

1. Field of the Invention

The present invention relates to a semiconductor memory device such as a dynamic random access memory (hereinafter called a "DRAM") comprising boosters each having a bootstrapping function for supplying a power source potential or higher to signal lines.

2. Description of the Related Art

A semiconductor memory device having boosters has heretofore been disclosed in Japanese Patent Application Publication No. 1-307092.

The boosters for generating a power source potential or higher when a desired word line is selected from the DRAM, have been described in the disclosure. The object of each booster described in the disclosure is to prevent a reduction in potential, which occurs owing to leakage current. Each of the boosters is activated based on a signal output from an oscillator.

In recent semiconductor memory devices such as a DRAM, etc., there has been a demand for the reading of data therefrom or writing of the data therein at high speed and with high accuracy. As a method of meeting such a demand, there has been considered a method wherein the timing for obtaining access to a memory array is made faster by making a time interval required for each booster to set a predetermined potential used upon selection of a desired word line, shorter than a conventional time interval and the set predetermined potential is maintained at a stable state as compared with the prior art.

SUMMARY OF THE INVENTION

It is an object of the present invention to provide a semiconductor memory device capable of rapidly and reliably setting up the timing for obtaining access to a memory cell array and reading data therefrom or writing the data therein at high speed.

It is another object of the present invention to provide a semiconductor memory device capable of reliably reading data therefrom or writing the data therein by maintaining the potential of a signal used for the selection of a desired word line at a stable state using boosters.

In order to achieve the above objects, a semiconductor memory device of the present invention comprises a memory cell to store data therein, a word line coupled to the memory cell, a bit line, coupled to the memory cell, to receive data from the memory cell upon the word line being maintained substantially at a first potential during a read out period, a transistor, having a gate electrode, to apply the first potential to the word line upon the gate electrode being maintained at or above the first potential level, a signal line to be maintained at a second potential, an inverter, connected to the signal line, to output a driving signal having a third potential substantially equal to the second potential in response to an activation signal, the inverter causing the signal line a voltage drop when the inverter is activated by the activation signal, a first voltage supply circuit to supply a main voltage signal in order to maintain the signal line at or above the first potential, and a second voltage supply circuit, operable in response to the activation signal, to supply a compensation voltage signal with the signal line so as to compensate the signal line for the voltage drop.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A semiconductor memory device according to the present invention will hereinafter be described in detail with reference to the accompanying drawings.

Figure 1:
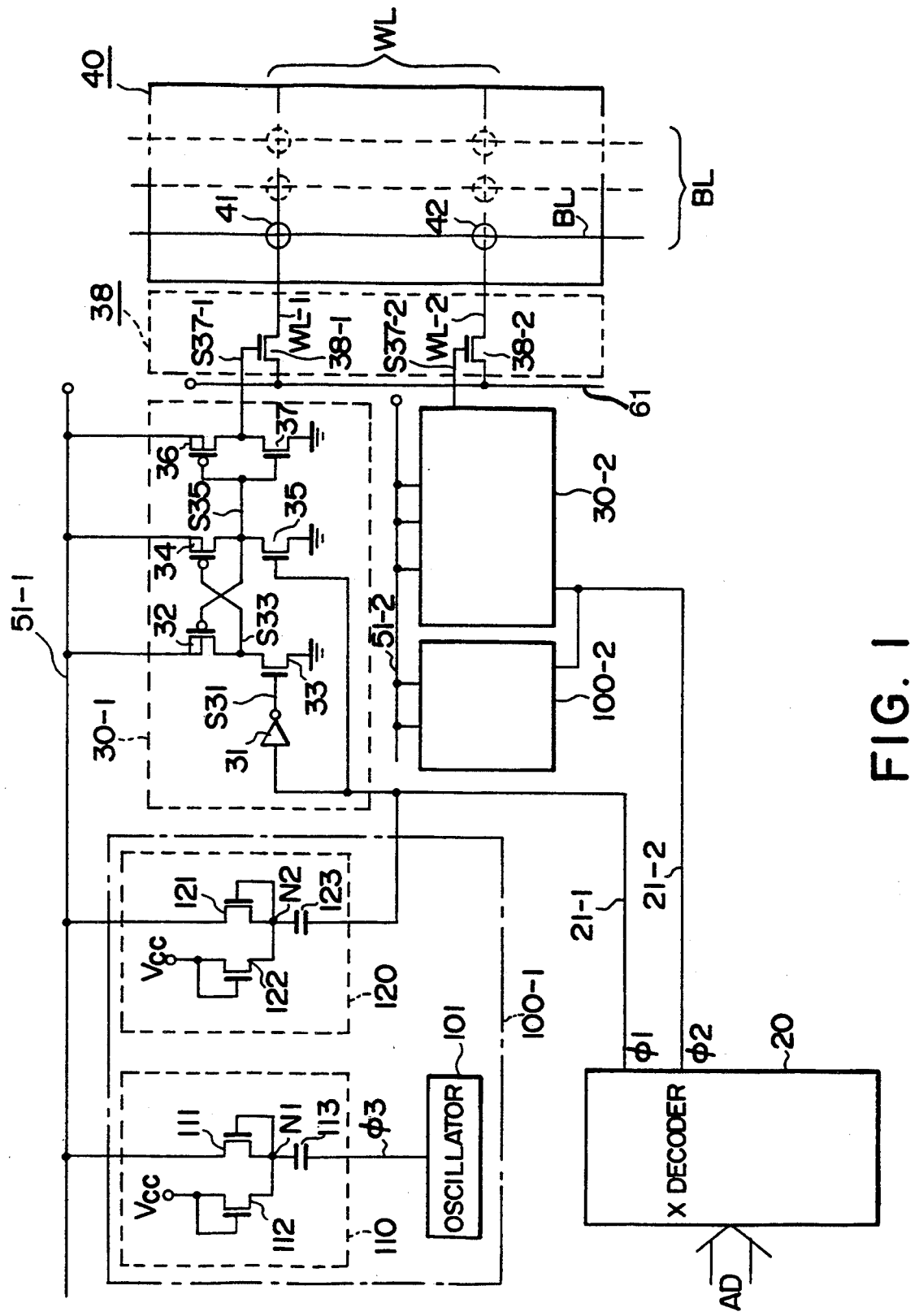
FIG. 1 is a circuit diagram showing a semi-conductor memory device according to the present invention, which has a plurality of boosters.

FIG. 1 is a circuit diagram of a semiconductor memory device according to the present invention. The semiconductor memory device comprises an X decoder 20, driving signal generators 30-1, 30-2, a memory cell array 40, boosting means 100-1, 100-2, signal conductors or lines 51-1, 51-2, 61, and a driver group 38.

The X decoder 20 is of a normally-used decoder. That is, the X decoder 20 is used as a circuit for decoding address data AD indicative of memory cells 41, 42 of the memory cell array 40 with respect to data having a request for reading or writing. The X decoder 20 outputs access request signals $\phi 1$, $\phi 2$ indicative of access to the data which had a request for reading or writing as a result of the decoding, from signal lines 21-1, 21-2.

In response to the access request signals $\phi 1$, $\phi 2$, the driving signal generators 30-1, 30-2 respectively output driving signals having potentials at the signal lines 51-1, 51-2 to the corresponding driver group 38 as word line selection signals S37-1, S37-2.

The memory cell array 40 has a plurality of memory cells 41, 42 accessed by word lines WL and bit lines BL. Each of the memory cells 41, 42 is normally comprised of a capacitor and a MOS transistor which are not shown. The gate electrode of the MOS transistor is normally electrically connected to its corresponding word line. A plurality of word lines WL-1, WL-2 for selecting the memory cells 41, 42 are electrically connected to their corresponding source electrodes of NMOS transistors 38-1, 38-2 which serve as drivers. The drain electrodes of the NMOS transistors 38-1, 38-2 are electrically connected to a signal line 61, whereas the gate electrodes thereof are electrically connected to the driving signal generators 30-1, 30-2 so as to receive the driving signals S37-1, S37-2 respectively.

The boosting means 100-1, 100-2 respectively set the potentials of the signal lines 51-1, 51-2 to voltages or potentials $V_{b1}$, $V_{b2}$ which enable the NMOS transistors 38-1, 38-2 to operate sufficiently, and hold the set potentials as they are. Each of the boosting means 100-1, 100-2 is made up of two boosters. A description will be made of the boosting means 100-1 alone. A main booster 110, which serves as a first booster, is operated in response to a clock signal corresponding to a signal output from an oscillator 101 activated when a power source is turned on, whereas a sub booster 120, which serves as a second booster, is operated in response to the access request signal $\phi 1$.

The signal line 61 has a potential $V_x$ which can obtain sufficient access to the memory cells 41, 42. The potential $V_X$ represents a potential which enables the MOS transistor of each memory cell to operate sufficiently. A description will now be made of the potential $V_X$ and potentials $V_{b1}$, $V_{b2}$. The potential $V_{b1}$ at the signal line 51-1 and the potential $V_{b2}$ at the signal line 51-2 are identical substantially to each other. The potential $V_{b1}$ can be expressed in accordance with the following equation:

$$V_{b1} = V_x + V_{t1} + \alpha$$

where $V_{t1}$ is a threshold voltage of the NMOS transistor 38-1

$\alpha$ is a margin for ensuring the potential $V_{b1}$

The potential $V_X$ can be represented in accordance with the following equation:

$$V_x = V_{BL} + V_{t2} + \beta$$

where $V_{BL}$ is the maximum potential of each bit line BL $V_{t2}$ is a threshold voltage of the MOS transistor of each memory cell $\beta$ is a margin for ensuring the potential $V_X$ A description will now be made of specific circuit configurations of the driving signal generators 30-1, 30-2 and the boosting means 100-1, 100-2. Incidentally, the NMOS transistors and PMOS transistors will be abbreviated as "NMOSs" and "PMOSs" respectively upon illustrating the circuit configurations.

The driving signal generator 30-1 comprises three PMOSs 32, 34, 36, three NMOSs 33, 35, 37 and an inverter 31. The source electrodes of the three PMOSs 32, 34, 36 are electrically connected to the signal line 51-1. The drain electrodes of the PMOSs 32, 34, 36 are electrically connected to the drain electrodes of the NMOSs 33, 35, 37 respectively. The source electrodes of the NMOSs 33, 35, 37 are grounded. The gate electrode of the PMOS 32 is electrically connected to the drain electrode of the PMOS 34 and the gate electrode of the PMOS 34 is electrically connected to the drain electrode of the PMOS 32. The gate electrode of the NMOS 33 is electrically connected with the signal line 21-1 via the inverter 31 and the gate electrode of the NMOS 35 is electrically connected with the signal line 21-1. Further, the gate electrodes of the PMOS 36 and the NMOS 37 are electrically connected with the drain electrode of the PMOS 34. The driving signal generator 30-2 is identical in circuit configuration to the driving signal generator 30-1.

Next, the boosting means 100-1 comprises the main booster 110 and the sub booster 120. The main booster 110 is comprised of two NMOSs 111, 112 and a capacitor 113. The source electrode of the NMOS 111 is electrically connected to the signal line 51-1. The drain and gate electrodes of the NMOS 111 are electrically connected to a node N1. Connected to the node N1 are one of both electrodes of the capacitor 113 and the source electrode of the NMOS 112. The other electrode of the capacitor 113 is electrically connected to the oscillator 101 so as to receive the clock signal $\phi 3$ indicative of the signal output from the oscillator 101. A power source potential $V_{cc}$ is applied to the drain and gate electrodes of the NMOS 112. Accordingly, the main booster 110 charges or discharges the capacitor 113 in response to the clock signal $\phi 3$ corresponding to the output of the oscillator 101 to thereby set the signal line 51-1 to the potential $V_{b1}$. The sub booster 120 has the same circuit configuration as that of the main booster 110. However, a capacitor 123 of the sub booster 120 is charged or discharged in accordance with the access request signal $\phi 1$ used as an alternative to the clock signal $\phi 3$.

The boosting means 100-2 is identical in circuit configuration to the boosting means 100-1.

Figure 2:
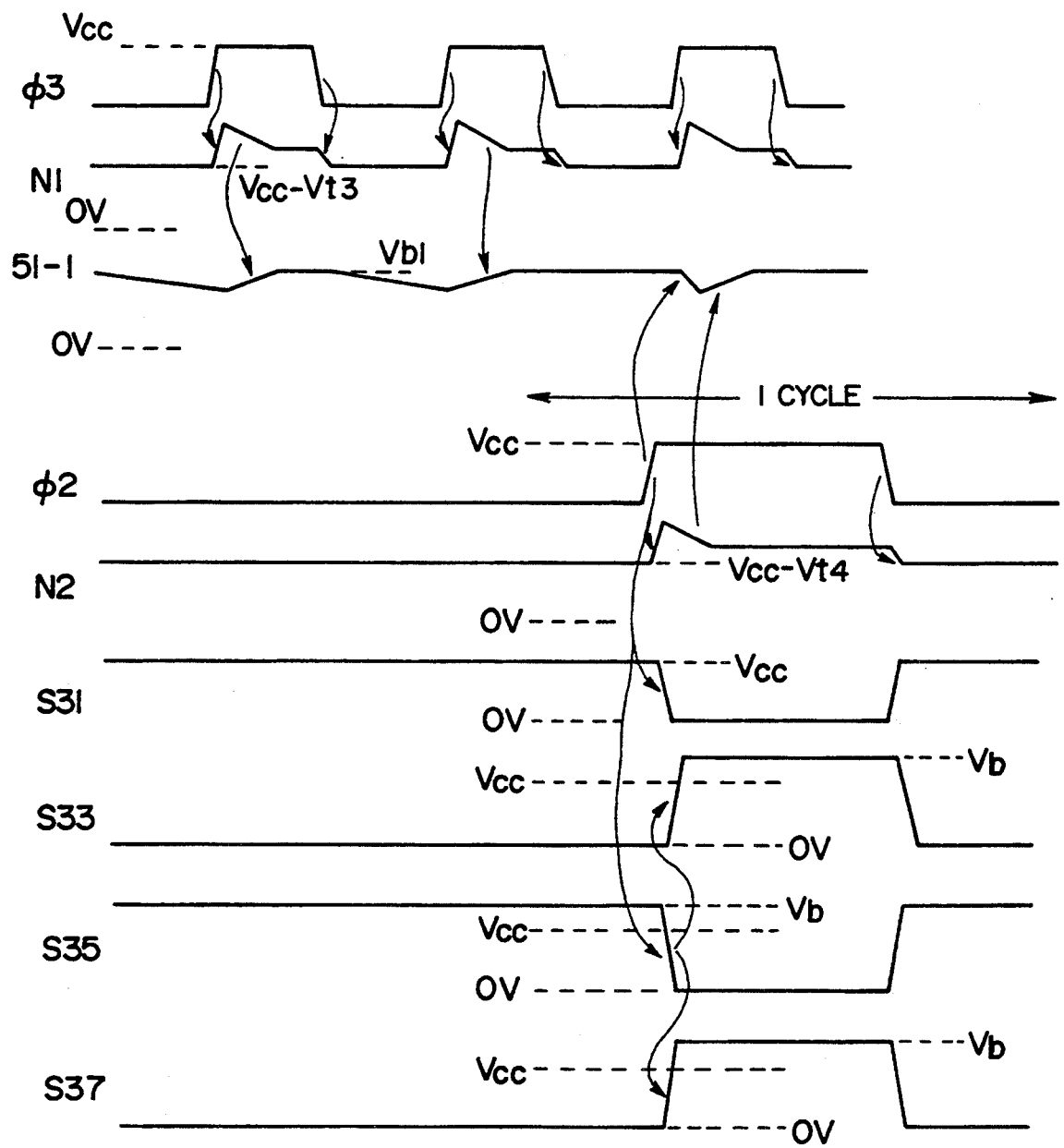
FIG. 2 is a waveform chart for describing the operation of the semiconductor memory device shown in FIG. 1.

The operation of the semiconductor memory device according to the present invention will next be described below. FIG. 2 is a waveform chart for describing the operation of the semiconductor memory device.

When the power source potential $V_{cc}$ is applied upon turning on the power source of the semiconductor memory device, the oscillator 101 is activated to generate the clock signal $\phi 3$. The capacitor 113 is charged or discharged in accordance with the clock signal $\phi 3$ generated from the oscillator 101 to thereby set the potential at the signal line 51-1 to the potential $V_{b1}$. Let's now assume that the potential $V_{b1}$ is slightly reduced owing to leak current or the like after a long period of time has elapsed since the setting of the signal line 51-1 to the potential $V_{b1}$ has been completed. However, in this case, the potential at the node N1 is set substantially to the power source potential or higher because the capacitor 113 is always charged or discharged in accordance with the clock signal $\phi 3$ output from the oscillator 101. The electric charge stored in the capacitor 113 is supplied to the signal line 51-1 via the NMOS 111 with an increase in the potential at the node N1, so that the reduced potential of the signal line 51-1 is returned to the potential $V_{b1}$. Incidentally, the oscillator 101 may not be operated at all times after the power source has been turned on. That is, the oscillator 101 may be activated when it is detected that the potential at the signal line 51-1 is lower than the potential $V_{b1}$.

The operation of the semiconductor memory device will now be described with reference to FIG. 2. When the clock signal $\phi 3$ is brought to a ground potential level (hereinafter called an "L" level), the node N1 is set to a potential $V_{cc} - V_{t3}$ (where $V_{t3}$ represents a threshold potential or voltage) by the NMOS 112 and the power source. At this time, the capacitor 113 is charged. The potential at the node N1 is supplied to the signal line 51-1 through the NMOS 111. When, on the other hand, the clock signal $\phi 3$ changes from the "L" level to a power source potential level (hereinafter called an "H" level), the capacitor 113 is discharged in accordance with the clock signal $\phi 3$. Thus, the potential at the node N1 increases with the discharge of the capacitor 113 and the raised potential is transmitted to the signal line 51-1. The signal line 51-1 is maintained at the potential $V_{b1}$ by repeatedly effecting such an operation according to the clock signal $\phi 3$.

When the signal line 51-1 is brought to the potential $V_{b1}$ by the main booster 110, the access request signals $\phi 1$, $\phi 2$ are output from the X decoder 20. Let's now assume that the access request signal $\phi 1$ is "H" in level and the access request signal $\phi 2$ is "L" in level in order to obtain access to each memory cell 41. The driving signal generators 30-1, 30-2 start operations in accordance with the access request signals φ1, φ2 respectively. The driving signal generator 30-1 brings a signal S31 to the "L" level in response to the access request signal φ1 to thereby make the NMOS 35 conductive and make the NMOS 33 non-conductive. Thus, a signal S33 is brought to a $V_b$ level (hereinafter called an "H"-1 level) so as to make the PMOS 34 non-conductive and make the PMOS 32 conductive, thereby changing a signal S35 from the "H"-1 level to the "L" level. As a result, the PMOS 36 and the NMOS 37 are respectively made conductive and non-conductive in accordance with the signal S35 so as to output the driving signal S37-1 having the potential $V_{b1}$. The driving signal generator 30-2 is opposite in operation to the driving signal generator 30-1. Thus, the driving signal generator 30-2 outputs the driving signal S37-2 including the ground potential.

When each of the driving signal generators is in operation, through current flows between the power source and the ground. As a result, the potential at the signal line 51-1 is reduced by a potential $V_\gamma$, for example. In order to rapidly supplement a reduction in the potential, it is necessary to make shorter the period of the clock signal φ3 output from the oscillator 101 and to increase the supply capacity of the clock signal φ3. When, however, such a measure is taken to meet the situation referred to above, the current to be used up increases. Therefore, the reduced potential $V_\gamma$ is supplemented by the sub booster 120 in order to avoid such inconvenience.

The sub booster 120 is operated in the same manner as the main booster 110. However, the sub booster 120 discharges the capacitor 123 in response to the "H" level of the access request signal φ1 so as to increase the potential at a node N2 from $V_{cc}-V_{t4}$ (where $V_{t4}$ is a threshold voltage of an NMOS 122). The potential at the node N2 is supplied to the signal line 51-1 so as to return the potential at the signal line 51-1, which has been reduced by the through current, to $V_{b1}$.

On the other hand, the NMOS 38-1 and the NMOS S38-2 are made conductive and non-conductive by the driving signals S37-1, S37-2 output from the driving signal generators 30-1, 30-2, respectively. Thus, a desired word line WL-1 is selected by the signal line 61 so that data are read from and written into the memory cells 41 electrically connected to the selected word line WL-1. One reading or writing operation is effected during one cycle shown in FIG. 2. This one cycle represents a time interval required for a DRAM to make a change from the time when a control signal $\overline{RAS}$ falls to the time when the control signal $\overline{RAS}$ rises.

The following advantageous effects can be brought about from the above embodiment.

(i) Since the signal line 51-1 is maintained at the potential $V_{b1}$ at all times by the main booster 110 after the power source has been put to work, it is unnecessary to provide a time interval required to set up the potential at the signal line 51-1. Therefore, the changeover of the access request signal φ1 from the "L" level to the "H" level can be made faster without the time interval required to set up the potential at the signal line 51-1, thereby making it possible to operate the driving signal generator 30-1 at high speed.

(ii) The two boosters 110, 120 are provided in the present embodiment. Therefore, when a reduction in the potential $V_{b1}$ of the signal line 51-1 occurs, a normal potential supplement is effected by the main booster 110. When, on the other hand, the potential is greatly reduced, a rapid potential supplement is carried out by the sub booster 120. Thus, the current is less consumed as a whole.

Another example of a sub booster will next be described below. This example shows an improvement in the sub booster 120 illustrated in FIG. 1. In the previous embodiment, the potential at the node N2 is raised from $V_{cc}-V_{t4}$ (where $V_{t4}$ represents the threshold potential of the NMOS 122) to $V_{b1}$. In the improved sub booster, however, a rise in the potential from $V_{cc}$ to $V_{b1}$ is effected so as to rapidly bring the signal line 51-1 to the potential $V_{b1}$.

Figure 3:
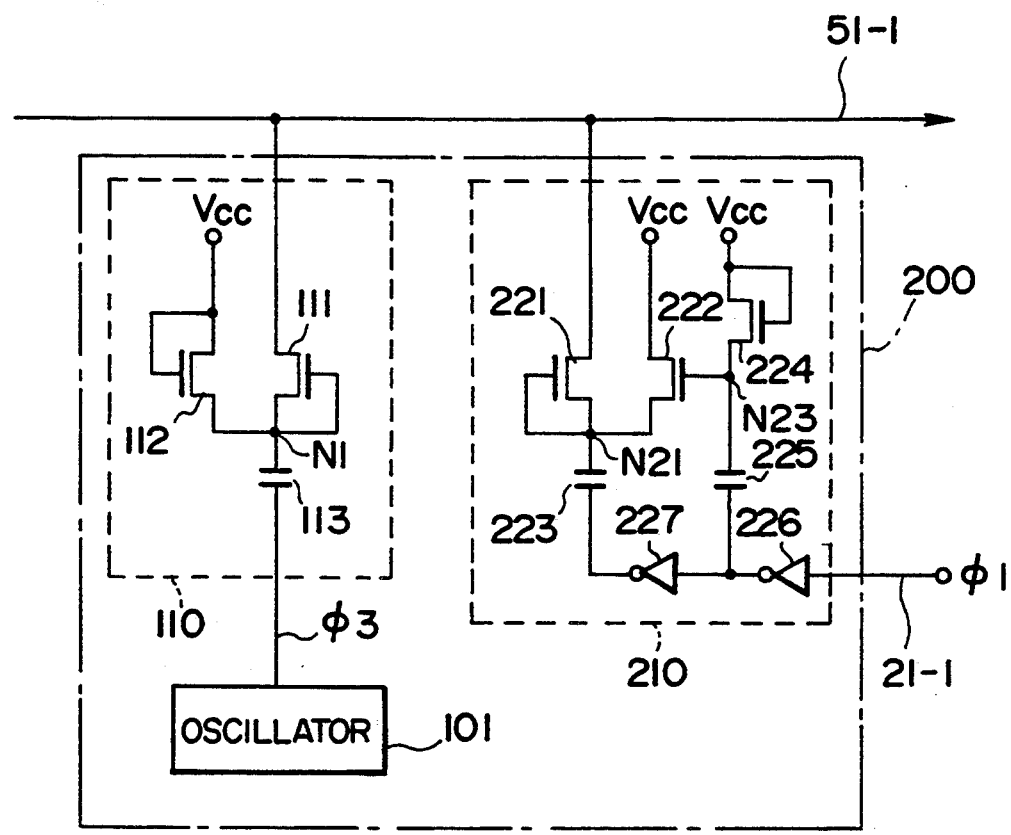
FIG. 3 is a circuit diagram showing another example of a booster employed in the semiconductor memory device according to the present invention.

The configuration of the improved sub booster will now be described below with reference to FIG. 3.

The sub booster 210 comprises NMOSs 221, 222, 224, capacitors 223, 225 and inverters 226, 227. The source electrode of the NMOS 221 is electrically connected to the signal line 51-1, whereas the drain and gate electrodes thereof are electrically connected to a node N21. One of both electrodes of the capacitor 223 and the source electrode of the NMOS 222 are electrically connected to a node N21. The other of the electrodes of the capacitor 223 is electrically connected to the signal line 21-1 via the two inverters 226, 227 so as to receive the access request signal φ1. The drain electrode of the NMOS 222 is supplied with the power source potential $V_{cc}$ and the gate electrode thereof is electrically connected to a node N23. Electrically connected to the node N23 are the source electrode of the NMOS 224 and one of both electrodes of the capacitor 225. The power source potential Vcc is applied to the drain and gate electrodes of the NMOS 224. The other of the electrodes of the capacitor 225 is electrically connected to the signal line 21-1 via the inverter 226 so as to receive the access request signal φ1.

The operation of the sub booster 210 will next be described.

When the access request signal φ1 is "L" in level, the signal ¢1 is inverted by the inverter 226 so as to be brought to an "H" level. Therefore, the potential at the node N23 increase from $V_{cc}-V_{t5}$ (where $V_{t5}$ is a threshold voltage of the NMOS 224). When the potential at the node N23 increases, the NMOS 222 is brought to a conducting state so as to cause the potential of the node N21 to reach the power source potential. When the access request signal ¢1 is brought to the "H" level, the output of the inverter 227 is also rendered "H" in level. Thus, the node N21 is set to the power source potential or above by the electric charge stored in the capacitor 223. Therefore, the signal line 51-1, which has been reduced in potential, is brought to $V_{b1}$ again by the NMOS 221.

According to the semiconductor memory device of the present invention, as has been described above, a predetermined potential used for selecting a desired word line can be set earlier in timing as compared with the conventional example. Further, the set predetermined potential can be maintained at a stable state as compared with the conventional example.

Incidentally, the present invention is not necessarily limited to the above embodiment. For example, the boosters 110, 120, 210 may comprise other transistors or the like. Further, the driving signal generators 30-1, 30-2 used with the signal lines 51-1, 51-2 each having the potential $V_b$ can be applied even to other circuit configuration such as the signal line 61, other than the circuit configuration for driving the word lines. Moreover, the above embodiment can also be applied to other memories other than the DRAM.

Having now fully described the invention, it will be apparent to those skilled in the art that many changes and modifications can be made without departing form the spirit or scope of the invention as set forth herein.

What is claimed is:

1. A semiconductor memory device for generating a control signal to select a word line, comprising:
   a memory cell for storing data therein;
   a word line coupled to said memory cell;
   a first voltage line for providing a first signal having a first potential level;
   a word line activation circuit coupled to said word line and said first voltage line, for supplying said first signal from said first voltage line to said word line in response to a control signal;
   a second voltage line for providing a second signal having a second potential level;
   a control circuit coupled to said second voltage line and said word line activation circuit, for outputting said control signal in response to an activation signal, said control signal having a potential corresponding to said second potential level;
   a first voltage supply circuit coupled to said second voltage line, for normally supplying a main voltage signal to said second voltage line to maintain said second voltage line at or above said second potential level; and
   a second voltage supply circuit coupled to said second voltage line, for supplying a compensation voltage signal to said second voltage line in response to said activation signal, in order to compensate said second voltage line at or above said second potential level.

2. The semiconductor memory device as in claim 1, wherein said word line activation circuit comprises a first transistor said first transistor having a first electrode coupled to said first voltage line, a second electrode coupled to said word line, and a first control electrode for receiving said control signal from said control circuit.

3. The semiconductor memory device as in claim 1, wherein said control circuit comprises an inverting circuit, said inverting circuit translating a signal having a potential level corresponding to said second potential level, as said control signal, to said word line activation circuit in response to said activating signal.

4. The semiconductor memory device as in claim 1, wherein said second voltage supply circuit comprises:
   a first transistor having a first electrode, a second electrode and a first gate electrode,
   a second transistor having a third electrode, a fourth electrode and a second gate electrode,
   a third transistor having a fifth electrode, a sixth electrode and a third gate electrode,
   a first capacitor having a seventh electrode and a eighth electrode,
   a second capacitor having a ninth electrode and a tenth electrode,
   a first inverter having a first input electrode and a first output electrode, and
   a second inverter having a second input electrode and a second output electrode,
   wherein said first electrode is coupled to said second voltage line, and said second electrode, said first gate electrode, said third electrode and said seventh electrode coupled to a first node, and said second gate electrode, said fifth electrode and said ninth electrode coupled to a second node, and said eighth electrode coupled to said first output electrode, and said tenth electrode and said first input electrode coupled to said second output electrode, and said fourth electrode, said sixth electrode and said third gate electrode receiving power voltage, and said second input electrode receiving said activating signal.

5. The semiconductor memory device as in claim 1, wherein said second voltage supply circuit comprises:
   a first transistor having a first electrode, a second electrode and a first gate electrode,
   a second transistor having a third electrode, a fourth electrode and second gate electrode, and
   a first capacitor having a fifth electrode and a sixth electrode,
   wherein said first electrode is coupled to said second voltage line, and said second electrode, said first gate electrode, said third electrode and said fifth electrode coupled to a first node, and said fourth electrode and said second gate electrode receiving power voltage, and said sixth electrode receiving said activating signal.

6. The semiconductor memory device as in claim 5, wherein said first voltage supply circuit comprises:
   a third transistor having a seventh electrode, a eighth electrode and a third gate electrode,
   a fourth transistor having a ninth electrode, a tenth electrode and fourth gate electrode, and
   a second capacitor having a eleventh electrode and a twelfth electrode,
   wherein a seventh electrode is coupled to said second voltage line, and said eighth electrode, said third gate electrode, said ninth electrode and said eleventh electrode coupled to a second node, and said tenth electrode and said third gate electrode receiving power voltage, and said twelfth electrode receiving a clock pulse signal output by an oscillator.

7. A semiconductor memory device for generating a control signal to select a word line, comprising:
   a memory cell for storing a data therein;
   a word line coupled to said memory cell;
   a first high voltage line for supplying a first boosted potential level;
   a word line activation circuit coupled to said word line and said first high voltage line for supplying said first boosted potential level to said word line in response to a control signal;
   a second high voltage line for supplying a second boosted potential level;
   a control circuit coupled to said second high voltage line and said word line activation circuit for outputting said control signal in response to an activation signal, said control signal having a potential corresponding to said second boosted potential level;
   a first boosting circuit coupled to said second high voltage line for normally boosting a potential level of said second high voltage line in order to maintain said second high voltage line at or above said second boosted potential level; and
   a second boosting circuit coupled to said second high voltage line for boosting the potential level of said second high voltage line in response to said activation signal in order to compensate the potential level of the second high voltage line.

8. The semiconductor memory device as in claim 7, wherein said word line activation circuit comprises a first transistor, said first transistor having a first electrode coupled to said first voltage line, a second electrode coupled to said word line, and a first control electrode for receiving said control signal.

9. The semiconductor memory device as in claim 7, wherein said control circuit comprises an inverting circuit, said inverting circuit translating a signal having a potential level corresponding to said second boosted potential level, as said control signal, to said word line activation circuit in response to said activating signal.

10. The semiconductor memory device as in claim 7, wherein said second boosting circuit comprises:
a first transistor having a first electrode, a second electrode and a first gate electrode,
a second transistor having a third electrode, a fourth electrode and a second gate electrode,
a third transistor having a fifth electrode, a sixth electrode and a third gate electrode,
a first capacitor having a seventh electrode and an eighth electrode,
a second capacitor having a ninth electrode and a tenth electrode,
a first inverter having a first input electrode and a first output electrode, and
a second inverter having a second input electrode and a second output electrode,
wherein said fist electrode is coupled to said second high voltage line, and said second electrode, said first gate electrode, said third electrode and said seventh electrode coupled to a first node, and said second gate electrode, said fifth electrode and said ninth electrode coupled to a second node, and said eighth electrode coupled to said first output electrode, and said tenth electrode and said first input electrode coupled to said second output electrode, and said fourth electrode, said sixth electrode and said third gate electrode receiving power voltage, and said second input electrode receiving said activating signal.

11. The semiconductor memory device as in claim 7, wherein said second boosting circuit comprises:
a first transistor having a first electrode, a second electrode and a first gate electrode,
a second transistor having a third electrode, a fourth electrode and second gate electrode, and
a first capacitor having a fifth electrode and a sixth electrode,
wherein said first electrode is coupled to said second high voltage line, and said second electrode, said first gate electrode, said third electrode and said fifth electrode coupled to a first node, and said fourth electrode and said second gate electrode receiving power voltage, and said sixth electrode receiving said activating signal.

12. The semiconductor memory device as in claim 11, wherein said first boosting circuit comprises:
a third transistor having a seventh electrode, a eighth electrode and a third gate electrode,
a fourth transistor having a ninth electrode, a tenth electrode and fourth gate electrode, and
a second capacitor having a eleventh electrode and a twelfth electrode,
wherein said seventh electrode is coupled to said second high voltage line, and said eighth electrode, said third gate electrode, said ninth electrode and said eleventh electrode coupled to a second node, and said tenth electrode, and said third gate electrode receiving power voltage, and said twelfth electrode receiving a clock pulse signal output by an oscillator.

13. A semiconductor memory device for generating a control signal to select a word line, comprising:
a memory cell for storing a data therein;
a word line coupled to said memory cell;
a first voltage line supplied a first potential level;
a word line activation circuit coupled to said word line and said first voltage line for supplying said first potential level to said word line in response to a control signal;
a second voltage line supplied a second potential level;
a control circuit coupled to said second voltage line and said word line activation circuit for outputting said control signal in response to an activation signal, said control signal having a potential corresponding to said second potential level;
a first voltage supplying circuit coupled to said second voltage line for supplying a voltage to said second voltage line in response to a clock pulse signal to maintain said second voltage line at or above said second potential level; and
a second voltage supplying circuit coupled to said second voltage line for supplying a voltage signal to said second voltage line when said activation signal is supplied to said control circuit, to compensate the voltage on said second potential voltage line.

14. The semiconductor memory device as in claim 13, wherein said word line activation circuit comprises a first transistor, said first transistor having a first electrode coupled to said first voltage line, a second electrode coupled to said word line, and a first control electrode for receiving said control signal.

15. The semiconductor memory device as in claim 13, wherein said control circuit comprises an inverting circuit, said inverting circuit translating a signal having a potential level corresponding to said second potential level, as said control signal, to said word line activation circuit in response to said activating signal.

16. The semiconductor memory device as in claim 13, wherein said second voltage supplying circuit comprises:
a first transistor having a first electrode, a second electrode and a first gate electrode,
a second transistor having a third electrode, a fourth electrode and a second gate electrode,
a third transistor having a fifth electrode, a sixth electrode and a third gate electrode,
a first capacitor having a seventh electrode and an eighth electrode,
a second capacitor having a ninth electrode and a tenth electrode,
a first inverter having a first input electrode and a first output electrode, and
a second inverter having a second input electrode and a second output electrode,
wherein said first electrode is coupled to said second high voltage line, and said second electrode, said first gate electrode, said third electrode and said seventh electrode coupled to a first node, and said second gate electrode, said fifth electrode and said ninth electrode coupled to a fourth node, and said twenty second electrode coupled to said first output electrode, and said tenth electrode and said first input electrode coupled to said second output electrode, and said fourth electrode, said sixth electrode and said third gate electrode receiving power voltage, and said second input electrode receiving said activating signal.

17. The semiconductor memory device as in claim 13, wherein said second voltage supplying circuit comprises:
- a first transistor having a first electrode, a second electrode and a first gate electrode,
- a second transistor having a third electrode, a fourth electrode and a second gate electrode, and
- a first capacitor having a fifth electrode and a sixth electrode,
- wherein said first electrode is coupled to said second voltage line, and said second electrode, said first gate electrode, said third electrode and said fifth electrode coupled to a first node, and said fourth electrode and said second gate electrode receiving power voltage, and said sixth electrode receiving said activating signal.

18. The semiconductor memory device as in claim 17, wherein said first voltage supplying circuit comprises:
- a third transistor having a seventh electrode, a eighth electrode and a third gate electrode,
- a fourth transistor having a ninth electrode, a tenth electrode and a fourth gate electrode, and
- a second capacitor having an eleventh electrode and a twelfth electrode,
- wherein said seventh electrode is coupled to said second voltage line, and said eighth electrode, said third gate electrode, said ninth electrode and said eleventh electrode coupled to a second node, and said tenth electrode and said third gate electrode receiving power voltage, and said twelfth electrode receiving said clock pulse signal.

* * * * *